United States Patent
Shei et al.

(10) Patent No.: US 7,358,173 B2
(45) Date of Patent: Apr. 15, 2008

(54) BUMPING PROCESS OF LIGHT EMITTING DIODE

(75) Inventors: Shih-Chang Shei, Tainan (TW); Jinn-Kong Sheu, Tainan County (TW)

(73) Assignee: South Epitaxy Corporation, Tainan Science-Based Industrial Park (TW)

( * ) Notice: Subject to any disclaimer, the term of this patent is extended or adjusted under 35 U.S.C. 154(b) by 193 days.

(21) Appl. No.: 10/711,280

(22) Filed: Sep. 7, 2004

(65) Prior Publication Data
US 2005/0176231 A1    Aug. 11, 2005

(30) Foreign Application Priority Data
Feb. 6, 2004    (TW) .............................. 93102733 A

(51) Int. Cl.
*H01L 21/44* (2006.01)
(52) U.S. Cl. ................. 438/612; 438/613; 438/614; 438/E21.511; 438/E21.508; 257/737; 257/738
(58) Field of Classification Search ........ 438/612–613; 257/737–738, 778
See application file for complete search history.

(56) References Cited

U.S. PATENT DOCUMENTS

| 6,756,294 B1* | 6/2004 | Chen et al. ............... 438/612 |
| 2002/0104449 A1* | 8/2002 | Lee ......................... 101/129 |
| 2002/0105076 A1* | 8/2002 | Lin .......................... 257/738 |
| 2002/0127836 A1* | 9/2002 | Lin et al. .................. 438/612 |
| 2003/0134496 A1* | 7/2003 | Lee et al. ................. 438/612 |
| 2004/0092092 A1* | 5/2004 | Yang ....................... 438/612 |
| 2007/0028445 A1* | 2/2007 | Su et al. ................... 29/840 |

FOREIGN PATENT DOCUMENTS

WO    WO 03/010833    2/2003

* cited by examiner

*Primary Examiner*—Dung A. Le
(74) *Attorney, Agent, or Firm*—Jianq Chyun IP Office

(57) ABSTRACT

A bumping process for a light emitting diode (LED) chip is provided. Firstly, a LED chip with a plurality of electrodes is provided, then a pattern plate having a plurality of openings is disposed on the LED chip, and the electrodes are correspondingly exposed by the openings. Then, a plurality of posts can be formed over the exposed electrodes by printing. After the printing process, the pattern plate is lifted and a reflow process is performed to the posts. The posts are formed by a printing process, the bumping process is less time-consuming and with lower costs and the height and the composition of the bumps con be precisely controlled, thus improving the reliability of LED die package structures.

8 Claims, 4 Drawing Sheets

BUMPING PROCESS OF LIGHT EMITTING DIODE

CROSS REFERENCE TO RELATED APPLICATIONS

This application claims the priority benefit of Taiwan application serial no. 93102733, filed on Feb. 6, 2004.

BACKGROUND OF INVENTION

1. Field of Invention

The present invention relates to a packaging process of a light-emitting diode (LED) device. More particularly, the present invention relates to a bumping process for a flip chip package structure of a light-emitting diode.

2. Description of Related Art

Recently, the light-emitting diodes (LEDs) employing gallium nitride-based (GaN-based) semiconductor materials such as gallium nitride (GaN), gallium aluminum nitride (GaAlN), and gallium indium nitride (GaInN), have been weighed to be potential. The III-nitride compounds have wide band energy gap and the light emitted by such compound ranging from the ultraviolet light to the red light, the wavelength of the which covers almost the entire waveband of the visible light.

The luminescence efficiency of the GaN-based LED device is determined by the two following main factors: (1) internal quantum efficiency of an active layer of the GaN-based LED device; and (2) light extraction efficiency of the GaN-based LED device. The internal quantum efficiency of the active layer is not only determined by the epitaxial quality, but also determined by the structure of the active layer. The loss of the light emitted by the active layer mainly results from the internal total reflection phenomenon within the GaN-based LED device, and the light extraction efficiency can be improved by decreasing the light loss. Furthermore, in the GaN-based LED device with a sapphire substrate, the anode and the cathode are both formed on the same surface of the active layer and will block out the light emitted from the underlying active layer. Due to limitations of the wire bonding technologies, the area of each bonding pad formed on the anode or the cathode must be larger than the minimum bonding area to ensure the bonding strength between wires and bonding pads. For example, the minimum diameter or the minimum width of each bonding pad is about 80 micrometers.

As described above, due to the limitations of the required minimum bonding areas and the shadow effects, the packaging process employing the wire bonding technology faces the above problems. Alternatively, a flip chip packaging process for the LED chip is developed. In the flip chip packaging process, bumps are formed on the anode and the cathode of a LED chip (the bumping process), and then the LED chip is flipped so that the anode and the cathode thereon con be electrically connected with a substrate through the bumps. Since the internal quantum efficiency of the active layer will not be degraded by thermal issues, the GaN-based LED devices fabricated by the flip chip packaging process provide enhanced light extraction efficiency and better heat dissipation performance. Therefore, the GaN-based LED devices with the flip chip package structures may become the future mainstream products.

FIGS. 1A to 1H are cross-sectional views of a conventional bumping process of light emitting diodes. Referring to FIG. 1A, firstly, a wafer 100 having a plurality of LED chips 102 is provided. Each LED chips 102 comprises a plurality of electrodes 110 (anode and cathode) and a passivation layer 120. The passivation layer 120 covers the surface of each LED chip 102 but exposes the electrodes 110. The passivation layer 120 con be made of inorganic compounds, for example, silicon nitride, silicon oxide or phosphosilicate glass (PSG) etc. Alternatively, the passivation layer 120 can be made of organic compounds, for example, polyimide etc.

Referring to FIG. 1B, a metal layer 130 is formed over the passivation layer 120 by sputtering or evaporation.

Referring to FIG. 1C and FIG. 1D, a photo-lithography/etch process is performed after the metal layer 130 is formed. Specifically, a photoresist layer 140 is formed on the metal layer 130, and then a photo-mask is provided above the photoresist layer 140 so that the pattern of the photo-mask can be transferred to the photoresist layer 140 through exposure and development to form a plurality of openings 142. The openings 142 expose the metal layer 130 located above the electrodes 110. Referring to FIG. 1E and FIG. 1F, a gold bump 150 and a solder layer 152 are sequentially formed in each opening 142 by electroplating gold (Au), tin (Sn) or lead(Pb). The gold bump 150 is formed directly on the metal layer 130, while the solder layers 152 formed on the gold bumps 150 are used for electrically connecting with a package substrate (not shown).

Referring FIG. 1G and FIG. 1H, the photoresist layer 140 is removed from the surface of the metal layer 130, and then a portion of the metal layer 130, which is not covered by the gold bumps 150, is removed by dry or wet etching. The metal layer 130 under the gold bumps 150 is remained as an under bump metallurgy (UBM) layer 132. Furthermore, a reflow process is performed to form Au/Sn or Pb/Sn eutectic between the bumps 150 and the solder layer 152, wherein the eutectic is used for enhancing adhesion characteristics between the solder layer 152 and a package substrate (not shown).

A plurality of bumps con be formed on the wafer by electroplating or evaporation, and the height of bumps formed on the wafer usually ranges from about several micrometers to more. However, the cost of the bumps formed by evaporation is quite high, and it is difficult to precisely control the height and the composition of the bumps. Even though, the cost of the bumps formed by electroplating is relatively lower, the cycle time and the total costs of the bumping process using electroplating are comparable due to necessary procedures, equipments and efforts of bumping process shown in FIG. 1A to FIG. 1H. In addition, since one layer can only be formed of a single metal material by electroplating, the flexibility of bumping process using electroplating is tightly limited and unable to meet requirements of various package structures.

SUMMARY OF INVENTION

The invention provides a bumping process for LED devices by applying a printing process to form bumps. The present invention affords a bumping process with low costs and flexible choices in materials.

As embodied and broadly described herein, the invention provides a bumping process for LED devices, comprising the following steps. Firstly, a wafer having a plurality of LED dies thereon is provided, wherein each of the LED dies comprises a plurality of electrodes. Then, an UBM (under bump metallurgy)layer is formed on each of the electrodes. Thereafter, a plurality of posts are formed on the UBM layers by a printing process, and then a reflow process is performed to the posts.

As embodied and broadly described herein, the bumping process, for example, further comprises the following steps. A plate having a plurality of openings is provided on the wafer before the printing process, wherein the UBM layer located on the electrodes is exposed by the openings of the plate. Then, a solder material is provided and the solder material is filled into the openings of the plate by a sapper, for example. Thereafter, the plate is removed so as to form the posts.

In the present invention, because the posts may be formed by a printing process, the bumping process is less time-consuming and with lower costs and the height and the composition of the bumps can be precisely control led, thus improving the reliability of LED die package structures.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
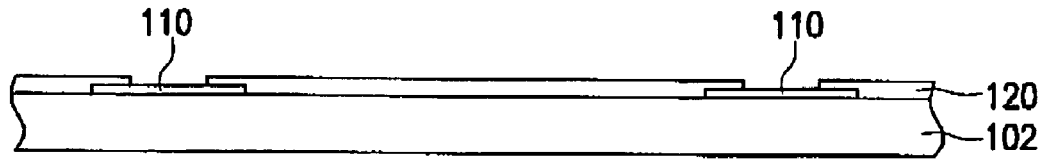
FIG. 1A to 1H are cross-sectional views of a conventional bumping process of LED devices.
Figure 1B:
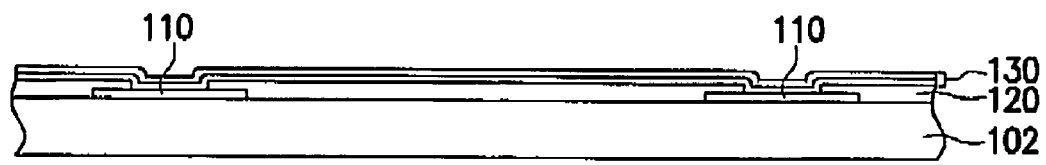
Figure 1C:
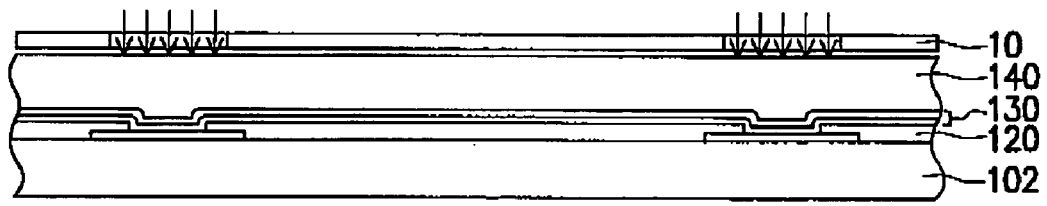
Figure 1D:
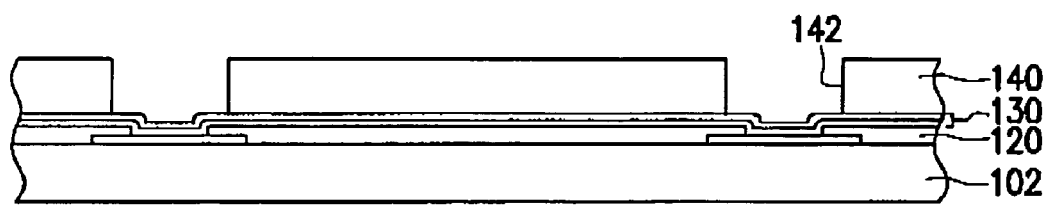
Figure 1E:
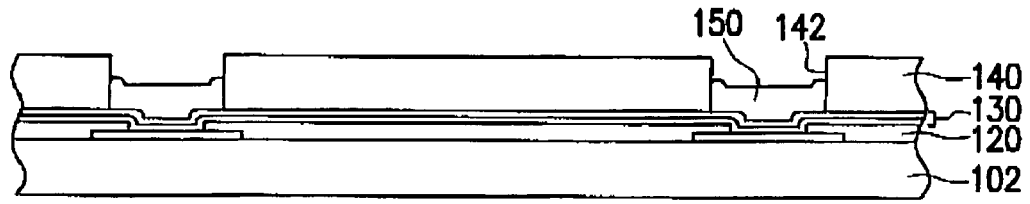
Figure 1F:
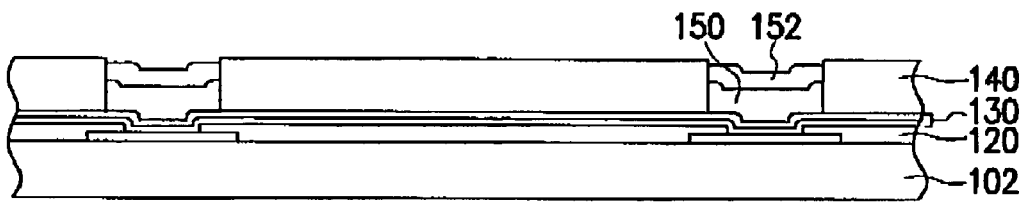
Figure 1G:
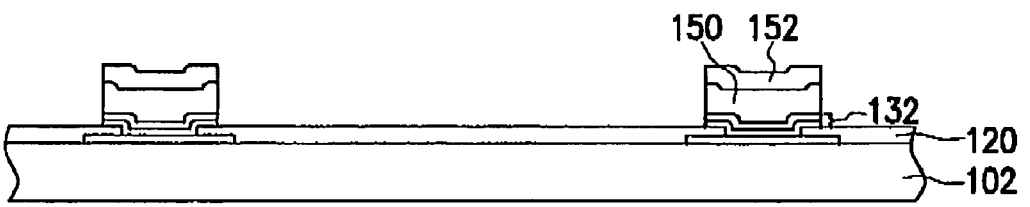
Figure 1H:
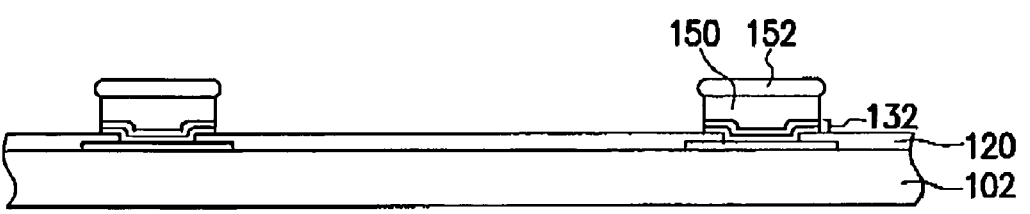
Figure 2A:
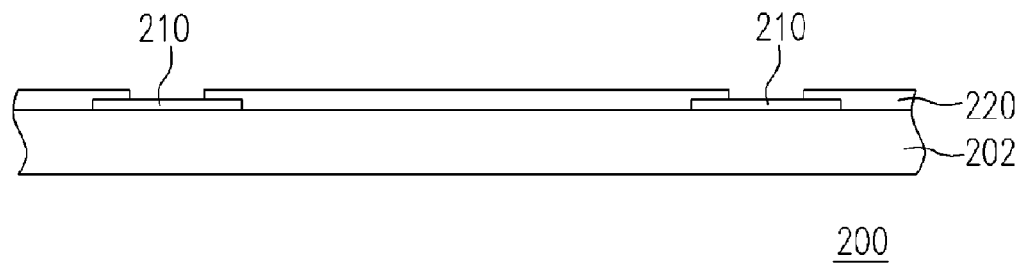
FIGS. 2A to 2E are cross-sectional views of a bumping process for light emitting diode devices according to one embodiment of this invention.

FIG. 2A to FIG. 2E are cross-sectional views of a bumping process for LED diode devices according to one preferred embodiment of this invention. Referring to FIG. 2A, a wafer 200 having a plurality of LED chips (dies) 202 thereon is provided. Each LED chip 202 comprises a plurality of electrodes 210 (including at least one anode and one cathode) and a passivation layer 220. The passivation layer 220 is disposed on the surface of the LED chip 202 and exposes the electrodes 210. The passivation layer 220 may be made of inorganic compounds, for example, silicon nitride, silicon oxide or phosphosilicate glass (PSG) etc. Alternatively, the passivation layer 220 may be made of organic compounds, for example, polyimide etc.

Figure 2B:
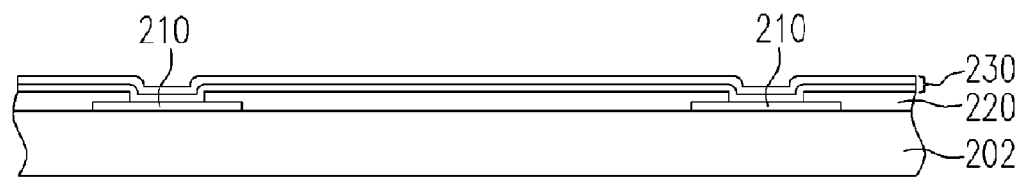

Referring to FIG. 2B, a metal layer 230 is formed covering the passivation layer 220 and the electrodes 210 by, for example, forming an adhesion layer, a barrier layer and a wetting layer sequentially by electroless plating. The material of the metal layer 230 can be selected from the group consisting of titanium (Ti), tungsten (W), chromium (Cr), nickel (Ni), copper (Cu), gold (Au) and alloys thereof. Then, the metal layer 230 is patterned by, for example, a photolithography/etch process, to form an under bump metallurgy (UBM) layer 232 on each of the electrodes 210. The UBM layer 232 can improve adhesion between the electrodes 210 and bumps to be formed later on.

Figure 2C:
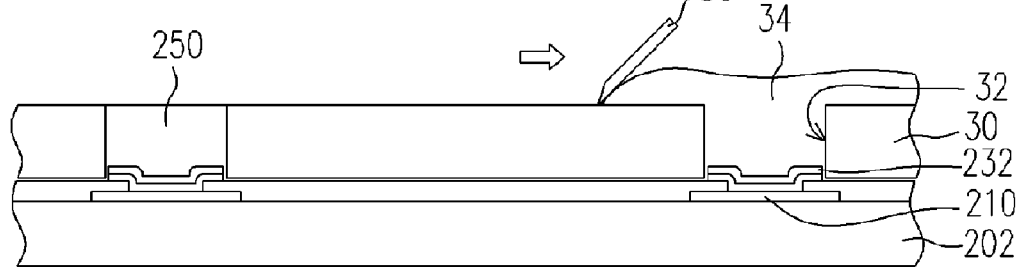

Referring to FIG. 2C, before performing the printing process, a pattern plate (i.e. a plate having a pattern) 30 having a plurality of openings 32 is disposed on the wafer 200 having a plurality of LED chips 202, while the UBM layers 232 located on the electrodes 210 are exposed by the openings 32 of the pattern plate 30. Then, a printing process is performed by providing a solder material 34 to the pattern plate 30, and filling the solder material 34 into the openings 32 of the pattern plate 30 by using a scraper 36, for example, so that a plurality of posts 250 is formed within the openings 32. The solder material 34 can be a solder paste or conductive materials, including Sn/Pb alloys or lead-free alloys comprising tin (Sn), silver (Ag) and copper (Cu), for example. The composition of the posts 250 can be accurately controlled. Taking the Sn/Pb paste as an example, the Sn/Pb ratio is controlled at 63/37 or 95/5. The printing process can be, for example, a screen printing process or a stencil printing process. By controlling the composition of the solder paste, the composition of the posts 250 formed by the printing process is more stable than that of posts formed by evaporation or electroplating.

Figure 2D:
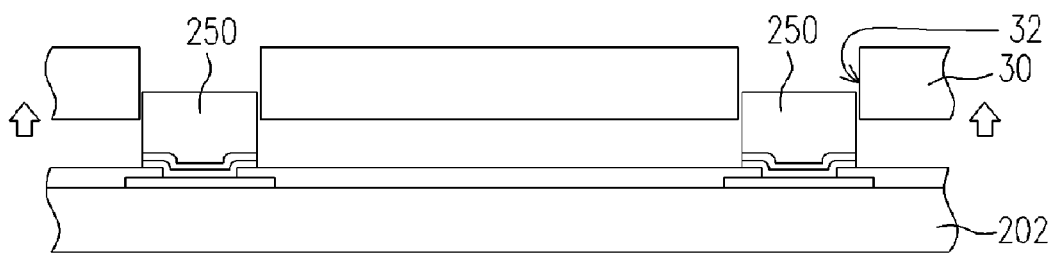

Referring to FIG. 2D, after the printing process, the pattern plate 30 is lifted from the wafer 200 (a lift-off process). Because the posts 250 joint tightly with the underlying UBM layers 232, each of the posts 250 is firmly disposed on each of the electrodes 210. Therefore, by using the pattern plate 30 and aligning the openings 32 with the electrodes 210, the posts 250 can align with the electrodes 210, and the height of the posts 250 can be controlled to substantially level with the thickness of the pattern plate 30.

Figure 2E:
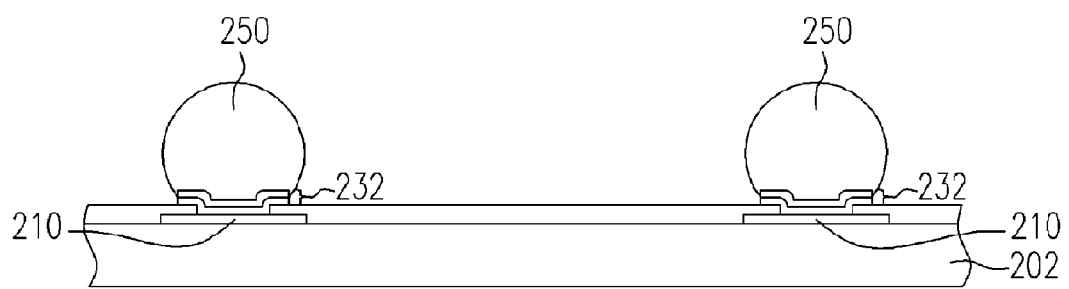

Thereafter, referring to FIG. 2E, are flow process is performed to the posts 250 so that the posts 250 is melten to form spheriod bumps. In the meanwhile, solvent exists in the posts 250 will be evaporated during the reflow process, therefore, the sphering bumps formed by above procedures have excellent adhesion characteristic with a package substrate (not shown).

As described above, the present invention provides a bumping process by using a printing process, thus reducing the cycle time and costs. Also, the height and the composition of bumps can be accurately control led so as to improve the reliability of LED chip package structures. In addition, the choices for the bump materials are diversified and flexible because the composition of the bumps con be adjusted by choosing solder materials (paste) of variable compositions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bumping process of a LED device, comprises:
   providing a wafer having a plurality of LED chips thereon, wherein each of the LED chips comprises a plurality of electrodes;
   forming an UBM (under bump metallurgy) layer on each of the electrodes;
   forming a plurality of posts on the under bump metallurgy layers by a printing process; and
   reflowing the posts.

2. The bumping process of claim 1, further comprises disposing a pattern plate having a plurality of openings on the wafer before the printing process, wherein the UBM layers located on the electrodes are exposed by the openings of the pattern plate.

3. The bumping process of claim 2, wherein the printing process comprises:
   applying a solder material onto the pattern plate; and
   filing the solder material into the openings of the pattern plate by a scraper.

4. The bumping process of claim 3, wherein after filling the solder material into the openings of the pattern plate, the printing process further comprises removing the pattern plate to form the posts and the solder material in the openings turns into the plurality of the posts.

5. The bumping process of claim 1, wherein a material of the solder posts comprises Sn/Pb alloy.

6. The bumping process of claim 1, wherein a material of the solder posts is selected from the coup consisting of tin (Sn), silver (Ag), copper (Cu) and alloys thereof.

7. The bumping process of claim 1, wherein the step of forming the UDM layers comprises performing electroless plating.

8. The bumping process of claim 1, wherein a material of the UBM layer is selected from the group consisting of titanium (Ti), tungsten (W), chromium (Cr), nickel (Ni), copper (Cu), gold (Au) and alloys thereof.

* * * * *